United States Patent [19]

Yasuda et al.

[11] Patent Number: 5,347,712
[45] Date of Patent: Sep. 20, 1994

[54] METHOD FOR MANUFACTURING A MULTILAYER WIRING BOARD

[75] Inventors: Nobuyuki Yasuda; Toshio Tamura; Hiroshi Toi; Akio Mishima, all of Kanagawa, Japan

[73] Assignee: Sony Corporation, Tokyo, Japan

[21] Appl. No.: 76,191

[22] Filed: Jun. 14, 1993

Related U.S. Application Data

[62] Division of Ser. No. 704,392, May 23, 1991, abandoned.

[30] Foreign Application Priority Data

May 25, 1990 [JP] Japan .................. 2-135665

[51] Int. Cl.$^5$ .............................. H01K 3/10
[52] U.S. Cl. .......................... 29/852; 29/846; 174/255; 174/261; 427/97; 437/217
[58] Field of Search ............ 29/846, 852; 51/413; 437/217; 174/255, 261, 262; 427/97

[56] References Cited

U.S. PATENT DOCUMENTS

| | | | |
|---|---|---|---|
| 3,319,317 | 5/1967 | Roche et al. | 174/264 |
| 4,076,575 | 2/1978 | Chang | 29/846 X |
| 4,511,757 | 4/1985 | Ohrs et al. | 174/262 |
| 4,642,160 | 2/1987 | Burgess | 29/852 X |
| 4,657,778 | 4/1987 | Moran | 29/846 X |
| 4,668,332 | 5/1987 | Ohruki et al. | 174/262 |
| 4,729,061 | 3/1988 | Brown | 174/262 |
| 4,896,464 | 1/1990 | Kim et al. | 51/413 X |
| 4,915,983 | 4/1990 | Lake et al. | 29/852 X |
| 4,935,584 | 6/1990 | Boggs | 174/262 |
| 4,980,270 | 12/1990 | Inasaka | 430/312 |
| 5,106,784 | 4/1992 | Bednarz | 437/217 X |
| 5,108,553 | 4/1992 | Foster et al. | 29/852 X |
| 5,170,245 | 12/1992 | Kim et al. | |

FOREIGN PATENT DOCUMENTS

| | | |
|---|---|---|
| 0207012 | 12/1986 | European Pat. Off. . |
| 0213805 | 3/1987 | European Pat. Off. . |
| 0346617 | 12/1989 | European Pat. Off. . |
| 1271235 | 6/1968 | Fed. Rep. of Germany . |
| 2602947 | 2/1988 | France . |
| 135665/90 | 5/1990 | Japan . |
| 790381 | 12/1980 | U.S.S.R. ........... 51/413 |

Primary Examiner—Carl J. Arbes
Attorney, Agent, or Firm—Hill, Steadman & Simpson

[57] ABSTRACT

A multilayer wiring board and a method for manufacturing the same are disclosed. The wiring board comprises an insulating substrate having a first and second conductor layers formed on major surfaces of the insulating substrate, a blind hole formed through the first conductor layer and the insulating substrate to expose the second conductor layer at the bottom of the blind hole, and a connecting conductor provided to cover the exposed surface of the second conductor layer wall portion of the blind hole and the first conductor layer. Since the connecting conductor and the second conductor are made in surface contact, connection reliability is very much improved. The blind hole is made by blasting a fine abrasive powder beam to selectively remove the insulating substrate. The end of selective removal can be easily controlled by the difference of working speed against the insulating substrate and the conductor layer to successfully expose the second conductor layer at the bottom of the blind hole.

5 Claims, 10 Drawing Sheets

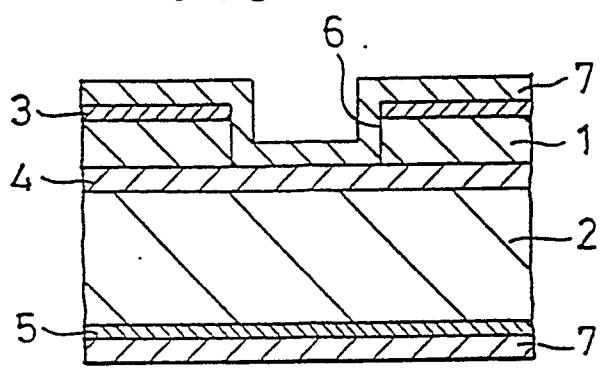
FIG 1
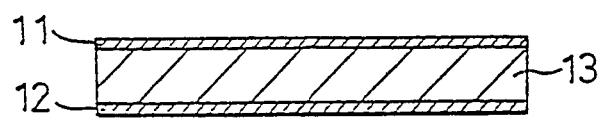
FIG. 2A
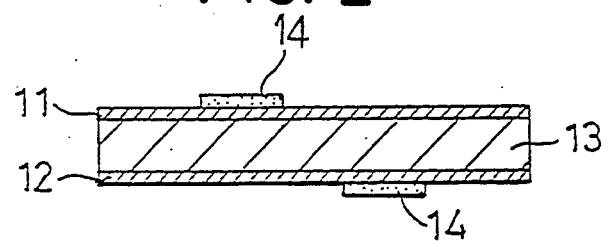
FIG. 2B
FIG. 2C
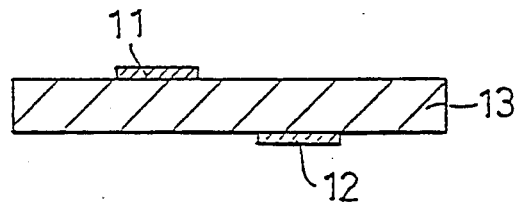

ically connected to the second conductor layer by the third conductor layer. Particularly, the second conductor layer and the third conductor layer are in surface contact with each other on the bottom surface of the hole portion formed through the insulating substrate. Accordingly, a remarkably large contact area between the second conductor layer and the third conductor layer can be ensured in comparison with the

METHOD FOR MANUFACTURING A MULTILAYER WIRING BOARD

This is a continuation, of application Ser. No. 07/704,392, filed May 23, 1991, now abandoned.

BACKGROUND OF THE INVENTION

The present invention relates to a wiring board having a blind through hole, and a method of manufacturing such a wiring board.

In a multilayer wiring board, if some conductor layers are connected with one another by a through hole passing through all layers, a substrate area in the other layers not required to be connected is also occupied by the through hole to cause a disadvantage from the viewpoint of high-density wiring. Accordingly, in designing a high-density multilayer wiring board, a so-called blind hole has been considered to be adopted. That is, a through hole is arranged between only the layers required to be connected, so as to increase a wiring density of the through hole and the pattern.

In general, formation of a through hole such as a via hole (i.e., a hole to be formed for the purpose of electrical connection only rather than insertion of parts) through an insulating substrate is carried out by drilling. However, if the blind hole as mentioned above is intended to be formed by drilling, the following problems are generated.

First, a tip of a drill to be used in drilling of a wiring board of this kind is mostly sharp, and it is difficult to control a depth of drilling. Therefore, it is difficult to precisely stop the drill at a certain position in the multilayer wiring board. Particularly in the case that a thickness of each insulating substrate is small, the adaptation of drilling to the board is difficult. It is also considered to use a drill having a flat tip. However, if a diameter of the drill is small, the drill is broken. In contrast, a large diameter of the drill counteracts the need of high-density wiring.

In another way, it has been developed that a plurality of double-sided substrates preliminarily formed with straight through holes are prepared, and these substrates are laminated to one another.

However, this method requires a high accuracy of positioning in laminating the substrates to make the working very troublesome. Further, there is a possibility that the through holes will be closed by adhesive or the like in laminating the substrates. In some case, there is a risk that resin will ooze out from an outermost through hole portion to largely damage the reliability of the wiring board. Additionally, the number of plating steps is increased to complicate a manufacturing step and increase a manufacturing cost. Moreover, as a thickness of a conductor to be etched is large, it is difficult to form a fine pattern.

In any methods as mentioned above, when a drill diameter is set to about 0.2 mm, a long working time is required to sacrifice a manufacturing cost. In contrast, when the drill diameter is set to about 0.3 mm or more, a working speed is in a level of mass production. However, such an increased drill diameter largely hinders the pursuit of reduction in diameter of the through hole for the purpose of high-density wiring.

Furthermore, in the case of adopting the drilling, the electrical connection between the conductor layers is relied solely on the contact between small end surfaces of the conductor layers exposed to a wall surface of a drilled hole and a plating layer formed on the wall surface of the drilled hole by through hole plating. Accordingly, the wiring board to be obtained has a disadvantage from the viewpoint of a current capacity, and it is also defective in connection reliability.

As another method to be substituted for the drilling, it is partly investigated to form a blind hole by working a polyimide resin with chemicals or laser. However, in the case that the insulating substrate is formed of a composite material consisting of the polyimide resin and a filler such as glass cloth, glass filler or aramid fiber, the working of the insulating substrate becomes difficult. In the case that the insulating substrate is formed solely of the polyimide resin, an insulation property, a mechanical strength, etc. of the insulating substrate become limited.

As described above, if the blind hole is intended to be formed by the prior art methods, there arise many problems in workability, reliability, etc., and there is a limitation in high-density wiring of the through hole and the pattern.

OBJECT AND SUMMARY OF THE INVENTION

In view of the above circumstances, it is accordingly an object of the present invention to provide a wiring board improved in workability, reliability and wiring density. A further object of the present invention to provide a method of manufacturing such a wiring board.

The wiring board according to the present invention comprises an insulating substrate formed of a filler and a molding material; a first conductor layer formed on a first major surface of the insulating substrate; a second conductor layer formed on a second major surface of the insulating substrate; a hole portion extending from the first conductor layer through the insulating substrate to the second conductor layer, the hole portion being formed by selectively removing the first conductor layer and the insulating substrate, the hole portion having a bottom surface to which a major surface of the second conductor layer is exposed; and a third conductor layer formed to cover the first conductor layer, a side wall surface of the hole portion, and the second conductor layer exposed to the bottom surface of the hole portion.

The manufacturing method according to the present invention comprises the steps of forming a conductor layer on a second major surface of an insulating substrate, forming a patterned mask on a first major surface of the insulating substrate for masking the insulating substrate against etching, blasting an abrasive powder from the side of the first major surface to selectively remove the insulating substrate at a portion uncovered by the mask, and stopping the etching by said abrasive powder owing to said conductor layer formed on the second major surface.

In the wiring board of the present invention, the first conductor layer is in contact with the third conductor layer, and the second conductor layer is also in contact with the third conductor layer, so that the first conductor layer is electrically connected to the second conductor layer by the third conductor layer. Particularly, the second conductor layer and the third conductor layer are in surface contact with each other on the bottom surface of the hole portion formed through the insulating substrate. Accordingly, a remarkably large contact area between the second conductor layer and the third conductor layer can be ensured in comparison with the case that the end surface of the second conductor layer exposed to the wall surface of the hole portion is in contact with the third conductor layer.

In the manufacturing method of the present invention, the formation of the blind hole through the insulating substrate is carried out by blasting of the abrasive powder beam. Accordingly, a depth of the blind hole can be reliably controlled by utilizing a difference between working speed to remove the insulating substrate and the conductor layer, and the blind hole is therefore precisely formed. Furthermore, a diameter of the blind hole to be formed by blasting of the abrasive powder can be made smaller than that to be formed by drilling. Therefore, the blind hole can be formed with a high density.

BRIEF DESCRIPTION OF THE DRAWINGS

FIG. 1 is a schematic sectional view of an essential part of a three-layer wiring board having a basic construction according to the present invention.

FIGS. 2A to 2K are schematic sectional views showing the manufacturing method of a four-layer wiring board in the order of the manufacturing steps according to the present invention.

FIGS. 5 to 7 are schematic sectional views of essential parts of multilayer wiring boards according to the present invention, wherein FIG. 5 shows a preferred embodiment of a four layer wiring board; FIG. 6 shows a preferred embodiment of a six-layer wiring board; and FIG. 7 shows a preferred embodiment of an eight-layer wiring board.

DESCRIPTION OF THE PREFERRED EMBODIMENTS

Figure 2D:
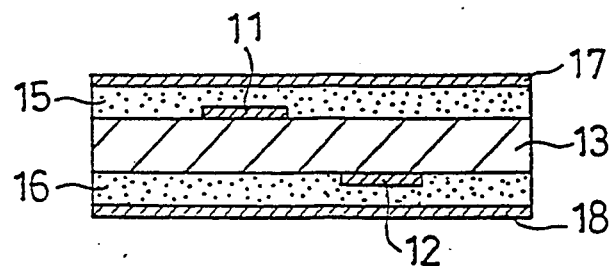

There will now be described some preferred embodiments of the present invention with reference to the drawings.

FIG. 1 shows a basic construction of a three-layer wiring board according to a preferred embodiment of the present invention.

The wiring board shown in FIG. 1 is comprised of two insulating substrates 1 and 2 and three conductor layers 3, 4 and 5, The conductor layers 3 and the conductor layer 4 are connected with each other by a so-called blind hole.

The insulating substrates 1 and 2 are formed by impregnating a molding material such as epoxy resin or imide resin into a filler (reinforcing material) such as glass cloth, glass fiber or aramid fiber. The conductor layers 3, 4 and 5 are formed by etching a copper foil or the like.

A hole portion 6 is formed through the first insulating substrate 1 in the state of a blind hole. The conductor layer 3 and the conductor layer 4 are electrically connected with each other at the hole portion 6 by a plating layer 7 formed by electroless plating. While an actual wiring board is naturally formed with a through hole passing through a thickness of the whole board, various patterns, etc. in addition to the above-mentioned blind hole, this preferred embodiment is illustrated by showing the construction of the blind hole portion only, and the explanation of the other constructions will be omitted.

A bottom surface of the hole portion 6 is formed as a flat surface, and it is disposed at the substantially same level as an upper surface level of the conductor layer 4 arranged in the wiring board. The upper surface of the conductor layer 4 is partially circularly exposed to the bottom surface of the hole portion 6. The plating layer 7 to be formed by electroless plating is so formed as to cover not only an upper surface of the conductor layer 3 provided on the insulating substrate 1 but also a wall surface of the hole portion 6 and the conductor layer 4 exposed to the bottom surface of the hole portion 6. Accordingly, the conductor layer 4 provided between the insulating substrates 1 and 2 is in surface contact with the plating layer 7 formed by electroless plating at the bottom surface of the hole portion 6 which bottom surface has an area equal to an opening area of the hole portion 6.

In the case that a diameter of the hole portion 6 is 0.3 mm, a contact area between the conductor layer 4 and the plating layer 7 becomes about 0.07 mm$^2$ irrespective of a thickness of the conductor layer 4. To the contrary, if a through hole passing through the thickness of the whole board is formed, and a thickness of an inner conductor layer is 35 $\mu$m, a contact area between the inner conductor layer and a through hole plating layer formed on a wall surface of the through hole becomes about 0.03 mm$^2$. Taking into consideration the fact that the smaller the thickness of the conductor layer, the smaller the contact area, the construction of the hole portion 6 according to this preferred embodiment is very advantageous from the viewpoint of connection reliability.

It is difficult to form the hole portion 6 by ordinary drilling. Therefore, the hole portion 6 is formed by etching such as blasting of a fine abrasive powder.

A method of manufacturing a four-layer wiring board by way of example will now be described.

As shown in FIG. 2A, copper foils 11 and 12 are first laminated on upper and lower surfaces of an insulating substrate 13.

As shown in FIG. 2B, an etching resist 14 is then formed on the copper foils 11 and 12 according to a desired wiring pattern. Thereafter, the copper foils 11 and 12 are etched to leave a part thereof corresponding to the wiring pattern as shown in FIG. 2C. The patterning of the etching resist 14 may be carried out by an ordinary photolithography, and the etching of the copper foils 11 and 12 may be arbitrarily selected from wet etching, dry etching, etc.

After thus obtaining a double-sided substrate, copper foils 17 and 18 are laminated through insulating layers 15 and 16 onto upper and lower surfaces of the double-sided substrate to obtain a four-layer structure as shown in FIG. 2D.

Figure 2E:
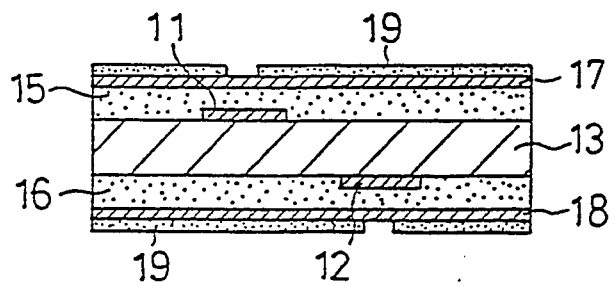

Then, as shown in FIG. 2E, a mask 19 is entirely formed on the copper foils 17 and 18, and a part of the mask 19 corresponding to blind holes to be formed later is removed. The mask 19 serves not only as a mask to be employed in wet etching the copper foils 17 and 18 but also as a mask to be employed in etching the insulating layers 15 and 16 by blasting of an abrasive powder to be hereinafter described. Accordingly, the mask 19 is preferably formed of a material having a sufficient resistance to the wet etching and a certain elasticity as in a dry resist film, for example. Although the material of the mask 19 is not necessarily photosensitive, this preferred embodiment employs a photosensitive urethane rubber for the material of the mask 19.

Figure 2F:
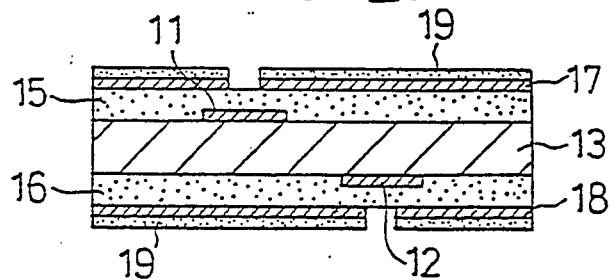

After thus forming the mask 19, a part of the copper foils 17 and 18 corresponding to the blind holes is removed by etching as shown in FIG. 2F.

Figure 2G:
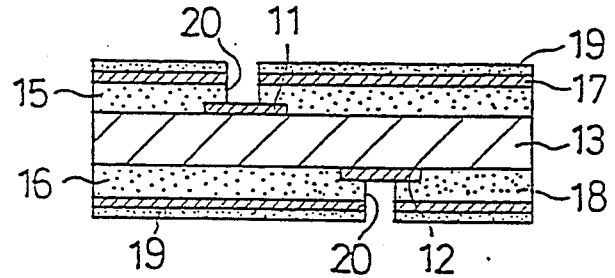

Thereafter, a part of the insulating layers 15 and 16 corresponding to the blind holes is etched off by blasting an abrasive powder to thereby form hole portions 20 in the state of the blind holes as shown in FIG. 2G.

Figure 3:
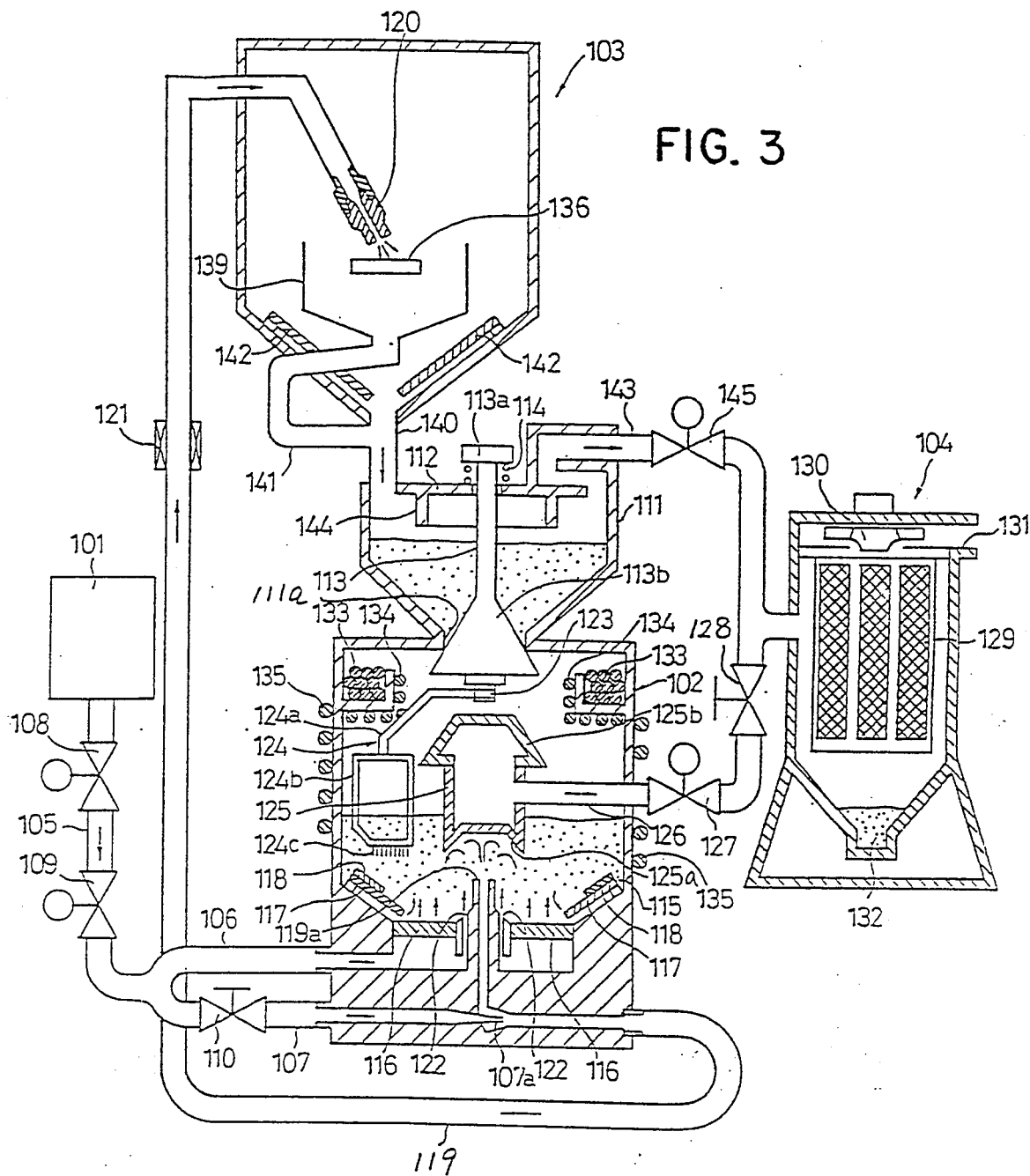
FIG. 3 is a schematic sectional view of an etching apparatus for forming a blind hole by blasting an abrasive powder according to the present invention.

FIG. 3 shows a preferred embodiment of an apparatus for forming the hole portions 20 by etching, that is, by blasting an abrasive powder.

The apparatus shown in FIG. 3 is generally constructed of an air compressor 101 for supplying a compressed air, a mixing chamber 102 for mixing an abrasive powder with the compressed air supplied from the air compressor 101, a blasting chamber 103 for blasting a mixture of the abrasive powder and the compressed air onto a workpiece, and an exhauster 104 for recovering the abrasive powder from the blasting chamber 103 by suction.

An air supply pipe 105 extends from the air compressor 101, and is divided into a first supply pipe 106 and a second supply pipe 107. Both the first supply pipe 106 and the second supply pipe 107 are connected to the mixing chamber 102. In the midway portion of the air supply pipe 105, there are provided a pressure regulating valve 108 for regulating a pressure of the compressed air to be supplied to the mixing chamber 102 and an electromagnetic valve 109 for controlling supply of the compressed air to be supplied to the mixing chamber 102. Further, at the upstream portion of the second supply pipe 107 is provided a flow regulating valve 110 for regulating a flow rate of the compressed air to the second supply pipe 107.

A supply section 111 for supplying the abrasive powder to the mixing chamber 102 is provided above the mixing chamber 102. The supply section 111 is provided with a cover 112 adapted to be opened in supplementing the abrasive powder into the supply section 111.

The abrasive powder is selected from fine particles having an average particle size of about 16 μm or less. Particularly in the case of reducing a diameter of the hole portion 20 for the purpose of high density of wiring, very fine particles having an average particle size of 3 μm or less may be employed for the abrasive powder. However, in the case of employing such very fine particles of 3 μm or less for the abrasive powder, it is necessary to set an angle of incidence of the abrasive powder to 40°–90° with respect to a normal line of the board as the workpiece in blasting the abrasive powder onto the board.

Further, a hardness of the abrasive powder to be employed is preferably larger than that of the board. Accordingly, preferable materials for the abrasive powder may include alumina, glass, ceramics material such as silicon dioxide, silicon carbide or boron carbide, and metal material such as Cu, Au, Ti, Ni, Cr or Fe, for example.

The supply section 111 is formed with a conical lower portion having a slant surface. The conical lower portion of the supply section 111 is formed at its central bottom position with a supply opening 111a communicated with the mixing chamber 102. A supply valve 113 is provided in the supply section 111 so that a conical lower portion 113b of the supply valve 113 is engaged with the supply opening 111a, and an upper portion of the supply valve 113 is inserted through the cover 112 at a central portion thereof to project upwardly of the cover 112. The upper portion of the supply valve 113 is formed at its upper end with a flange 113a. A coil spring 114 is interposed between the flange 113a and the cover 112 so as to normally bias the flange 113a upwardly. Accordingly, a conical surface of the conical lower portion 113b is normally maintained in close contact with an inner surface of the supply opening 111a to thereby close the supply opening 111a. In supplying the abrasive powder from the supply section 111 to the mixing chamber 102 as required, the flange 113a of the supply valve 113 is depressed against a biasing force of the coil spring 114 to release the close contact of the conical lower portion 113b with the supply opening 111a and thereby permit falling of the abrasive powder from the supply section 111 into the mixing chamber 102.

The mixing chamber 102 is defined by a cylindrical container, and the abrasive powder 115 is accommodated in the cylindrical container. The mixing chamber 102 is formed with a conical bottom portion. The conical bottom portion of the mixing chamber 102 includes a central opening and a conical slant surface. A disk-like filter 116 is fitted with the central opening of the conical bottom portion of the mixing chamber 102. The filter 116 is formed from a cermet plate (i.e., a porous plate to be formed by sintering a metal powder, which porous plate has numerous fine pores). The first supply pipe 106 extending from the air compressor 101 is connected to a back surface of the filter 116. Accordingly, the compressed air supplied from the air compressor 101 to the first supply pipe 106 is introduced through the filter 116 into the mixing chamber 102.

Further, a plurality of vibrating means 117 are provided on the conical slant surface of the mixing chamber 102 around the filter 116. Each vibrating means 117 is formed from a so-called bimorph constructed of a pair of upper and lower piezoelectric elements and electrodes. The plural vibrating means are annularly arranged in such a manner that a free end of each vibrating means is disposed above the filter 116, and a base end of each vibrating means is fixed to the conical slant surface of the mixing chamber 102.

The free end of each vibrating means 117 is adapted to be vertically vibrated by applying a predetermined alternating voltage thereto, so that the vibrating means 117 can provide an air vibrator effect such that the abrasive powder 115 is mechanically dispersed, and simultaneously it is agitated and mixed with the compressed air from the filter 116. A frequency of the alternating voltage to be applied may be high frequency of about 200–400 Hz, for example, and it is preferably substantially equal to a resonance frequency of the bimorph. Further, it is more effective to reverse the phases of vibration of the adjacent vibrating means 117 to each other.

A rubber sheet 118 is attached to the vibrating means 117 so as to cover a half portion of each vibrating means 117 on the side of the base end thereof, so that the abrasive powder 115 is prevented from entering the underside of the vibrating means 117 to hinder the vibration.

A feed pipe 119 for feeding the abrasive powder 115 agitated and dispersed by the compressed air in the mixing chamber 102 is connected to the mixing chamber 102 in such a manner that an upstream end portion of the feed pipe 119 passes through the bottom portion of the container defining the mixing chamber 102, and extends vertically through a central portion of the filter 116 to open into the mixing chamber 102. A downstream end 107a of the second supply pipe 107 is inserted into the upstream end portion of the feed pipe 119, so that a vacuum is generated in the upstream end portion of the feed pipe 119 by an air flow of the compressed air supplied from the second supply pipe 107, and the abrasive powder 115 is accordingly sucked from the mixing chamber 102 into the feed pipe 119 by the vacuum, thus feeding the abrasive powder 115 mixed with the compressed air in the feed pipe 119. The feed pipe 119 extends to the blasting chamber 103, and a nozzle 120 is provided at a downstream end of the feed pipe 119. Further, vibrating means 121 is provided at a midway portion of the feed pipe 119, so as to prevent deposition of the abrasive powder 115 at the midway portion of the feed pipe 119.

The feed pipe 119 is formed from a flexible tube such as urethane tube, nylon tube or vinyl tube, and it is so arranged as to be bent gently rather rapidly. Further, a connecting portion of the feed pipe 119 has a structure with no steps or the like such that the compressed air does not stay, and the abrasive powder 115 is prevented from being deposited to plug the pipe 119.

A blowing hole 122 is formed around the upright end portion of the feed pipe 119 at the central portion of the filter 116, so as to inject a part of the compressed air supplied from the first supply pipe 106 into the mixing chamber 102, thereby generating a turbulent flow near an inlet 119a of the feed pipe 119 and strongly agitating the abrasive powder 115.

In the mixing chamber 102 is provided a stirring mechanism 124 connected to a rotary shaft 123 fixed to a bottom surface of the supply valve 113. The stirring mechanism 124 is constructed of an arm 124a extending from the rotary shaft 123, a frame 124b formed from a metal fine line (i.e., wire) or the like, and a brush 124c provided along a lower edge of the frame 124b. Accordingly, the stirring mechanism 124 functions to grind a mass of the abrasive powder 115 coagulating in the mixing chamber 102 by rotating the rotary shaft 123.

A powder collector 125 is provided in the mixing chamber 102 at a position just above the inlets 119a of the feed pipe 119. The powder collector 125 is formed at its bottom portion with a trapezoidal recess 125a opposed to the inlet 119a of the feed pipe 119. An upper half of the powder collector 125 is constructed as a filter 125b formed of a porous material, and it is connected through a discharge pipe 126 to the exhauster 104. In the midway portion of the discharge pipe 126, there are provided an electromagnetic valve 127 for controlling flow and quantity of the exhaust air and an exhaust quantity regulating valve 128.

The exhauster 104 includes a filter 129 and a suction fan 130. The exhaust air from the discharge pipe 126 is sucked through the filter 129 by the suction fan 130, and is then exhausted from an exhaust opening 131. Accordingly, the exhaust air from the mixing chamber 102 is purified by the filter 129, and is thereafter exhausted to the outside of the exhauster 104. The abrasive powder filtered off by the filter 129 is gathered in a powder receiving portion 132 provided below the filter 129.

Further, moisture absorbing means 133 such as silica gel and heating means 134 such as heater are provided at an upper portion of the mixing chamber 102, and a heater 135 is wound around the mixing chamber 102, so as to maintain a dry condition of the abrasive powder 115 and prevent coagulation thereof in the mixing chamber 102.

The nozzle 120 mounted to the downstream end of the feed pipe 119 extending from the mixing chamber 102 is provided in the blasting chamber 103, and a workpiece 136 (i.e., the board having the construction shown in FIG. 2F) is so located as to face the nozzle 120.

Figure 4:
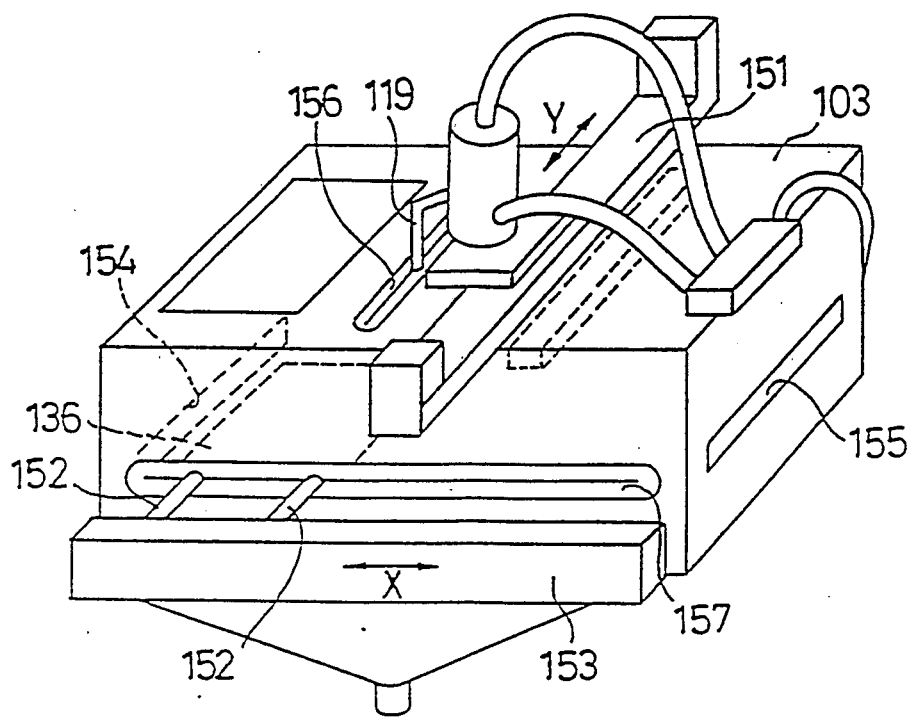
FIG. 4 is a schematic perspective view of a blasting chamber shown in FIG. 3.

As shown in FIG. 4, the nozzle 120 is movable in opposite directions as depicted by a double headed arrow Y by means of a moving mechanism 151 provided on a top wall of the blasting chamber 103. On the other hand, a pair of arms 152 retaining the workpiece 136 are movable in opposite directions and depicted by a double headed arrow X by means of a moving mechanism 153 provided on a side wall of the blasting chamber 103. Accordingly, the nozzle 120 can be moved relative to the workpiece 136 in the X and Y directions by operating the moving mechanisms 151 and 153, thereby forming a hole at an arbitrary position on the workpiece 136.

The wall of the blasting chamber 103 is formed with an inlet opening 154 and an outlet opening 155 for the workpiece 136, and is also formed with slits 156 and 157 having lengths corresponding to moving ranges of the nozzle 120 and the arms 152, respectively. All of the inlet opening 154, the outlet opening 155, and the slits 156 and 157 are covered with a rubber seal or an air curtain, so as to prevent leakage of the abrasive powder 115 out of the blasting chamber 103.

Referring back to FIG. 3, the workpiece 136 is surrounded by a suction box 139, so as to prevent scattering of the abrasive powder 115 in the blasting chamber 103. If the abrasive powder 115 is scattered in the blasting chamber 103, there is a danger that the abrasive powder 115 will leak out of the blasting chamber 103 when an operator opens a door of the blasting chamber 103, for instance, and a recovery efficiency of the abrasive powder 115 is also reduced.

A bottom portion of the blasting chamber 103 is formed in a conical shape, and a return pipe 140 extends downwardly from a lower end of the bottom portion of the blasting chamber 103. Similarly, a return pipe 141 extends downwardly from a lower end of the suction box 139. Both the return pipes 140 and 141 are communicated through the cover 112 at one end thereof into the supply section 111. Further, a plurality of vibrating means 142 such as bimorphs are provided on the bottom portion of the blasting chamber 103, so as to quickly discharge the abrasive powder 115 falling in the blasting chamber 103 by air vibration.

An exhaust pipe 143 is connected at its upstream end through the other end of the cover 112 to the supply section 111. A downstream end of the exhaust pipe 143 is joined with the discharge pipe 143 to be connected to the exhauster 104. Further, a cylindrical partition plate 144 depends from the cover 112. Accordingly, the abrasive powder 115 recovered from the blasting chamber 103 through the return pipes 140 and 141 into the supply section 111 is broadly classified to fall in the supply section 111 during rotation around the cylindrical partition plate 144 owing to the principle similar to that of a cyclone. On the other hand, the unnecessary air in the supply section 111 is fed through the exhaust pipe 143 to the exhauster 104. In the midway portion of the exhaust pipe 143 is provided an electromagnetic valve 145 for controlling flow of the exhaust air from the supply section 111 to the exhauster 104.

The apparatus as constructed above is operated as follows:

The compressed air supplied from the air compressor 101 is first divided to flow into the first supply pipe 106 and the second supply pipe 107. The compressed air flowing into the first supply pipe 106 is supplied through the filter 116 or the blowing hole 122 into the mixing chamber 102. At this time, the abrasive powder 115 in the mixing chamber 102 is agitated by the air vibrator effect exhibited by the compressed air penetrating into the abrasive powder 115. Simultaneously, a part of the abrasive powder 115 is collected near the inlet 119a of the feed pipe 119 by the recess 125a of the powder collector 125.

During the agitation of the abrasive powder 115 as mentioned above, the mechanical dispersion by the vibrating means 117 is simultaneously carried out to effectively maintain the air vibrator effect. Further, the electromagnetic valve 127 provided at the midway portion of the discharge pipe 126 connected to the powder collector 125 and the electromagnetic valve 145 provided at the midway portion of the exhaust pipe 143 connected through the cover 112 to the supply section 111 are controlled in such a manner that an open condition of the valve 127 and an open condition of the valve 145 are alternated with a given period. Accordingly, there is generated a pressure differential in the mixing chamber 102 by such an alternate operation of the electromagnetic valves 127 and 145, and the agitation of the abrasive powder 115 in the mixing chamber 102 is promoted by this pressure differential. However, when the exhaust air quantity regulating valve 128 is operated to reduce a quantity of the exhaust air from the mixing chamber 102 down to a certain value, the above-mentioned pressure differential becomes small so that the abrasive powder 115 may be injected at a substantially constant rate irrespective of the periodic alternate operation of the electromagnetic valves 127 and 145.

On the other hand, the compressed air flowing into the second supply pipe 107 is fed straight into the feed pipe 119 to generate a vacuum in the feed pipe 119 due to an air flow injected from the second supply pipe 107. Accordingly, the abrasive powder 115 collected near the inlet 119a is sucked into the feed pipe 119, and is mixed with the compressed air in the feed pipe 119.

The mixture of the compressed air and the abrasive powder 115 is fed through the feed pipe 119 to the nozzle 120, and is injected from the nozzle 120 onto a work surface of the workpiece 136. Thus, the work surface of the workpiece 136 is etched by the abrasive powder 115 to form a hole. A blasting speed of the abrasive powder 115 is preferably 50 m/sec or more, and more preferably 50 km/sec or more.

The abrasive powder 115 after used is returned through the return pipes 140 and 141 to the supply section 111 for the purpose of reuse.

In forming the hole portion 20 by blasting the abrasive powder with use of the above apparatus, a diameter of the hole portion 20 is preferably 500 $\mu$m or less in consideration of high-density wiring, and more preferably 300 $\mu$m or less.

While the hole portion 20 may be formed as a single hole, it is preferably formed as an aggregate of fine holes. In the latter case, a sectional area of a conductor layer at the hole portion 20 can be enlarged to thereby obtain a large current capacity. For instance, in the case of forming a single hole having a diameter of 0.3 $\mu$m as the hole portion 20, a sectional area of a plating layer having a thickness of 20 $\mu$m at the hole portion 20 becomes 0.019 mm$^2$. In contrast, in the case of forming twelve fine holes each having a diameter of 0.05 $\mu$m as the hole portion 20, the sectional area of the plating layer having the same thickness as above becomes 0.038 mm$^2$.

While the hole portion 20 is required to be formed as a so-called blind hole, the formation of the hole portion 20 by etching or blasting by the abrasive powder can be stopped by the copper foils 11 and 12 as the inner conductor layers since an etching rate to the insulating layer is largely different from an etching rate to the copper foil. For instance, in the case of using an alumina powder having an average particle size of 10 $\mu$m as the abrasive powder, the etching rate to the copper foil becomes about 2 $\mu$m//min, while the etching rate to a epoxy resin impregnated glass cloth substrate becomes about 25 $\mu$m/min provided that a blasting speed of the alumina powder is 250 m/sec. Further, in the case that the blasting speed is 300 m/sec, the etching rate to the copper foil becomes about 5 $\mu$m/min, while the etching rate to the epoxy resin impregnated glass cloth substrate becomes about 32 $\mu$m/min.

In the above-mentioned process, the mask 19 is employed as both an etching mask for the copper foils 17 and 18 and an etching mask for the hole portions 20. However, the mask 19 may be employed only as an etching mask to be used in etching the copper foils 17 and 18, and the copper foils 17 and 18 may be utilized as a mask to be formed in forming the hole portions 20 by blasting of the abrasive powder. Further, although the copper foils 17 and 18 are partially removed by etching such as wet etching or dry etching, and the hole portions 20 are formed by blasting of the abrasive powder in the above preferred embodiment, both the etching of the copper foils 17 and 18 and the formation of the hole portions 20 may be collectively carried out by blasting of the abrasive powder.

Figure 2H:
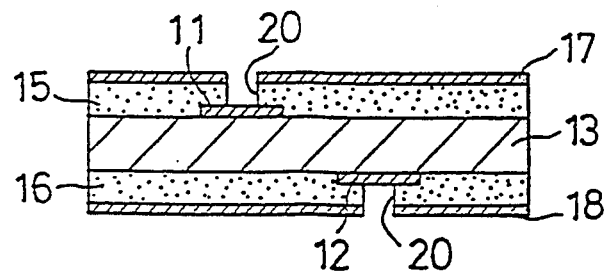

After forming the hole portions 20 by blasting of the abrasive powder as mentioned above, the mask 19 is removed as shown in FIG. 2H.

Figure 2I:
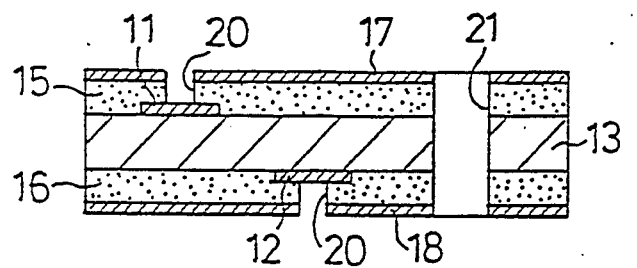

Then, as shown in FIG. 2I, a straight through hole 21 is formed through the thickness of the whole board. The formation of the through hole 21 may be carried out by blasting of the abrasive powder or by ordinary drilling.

Figure 2J:
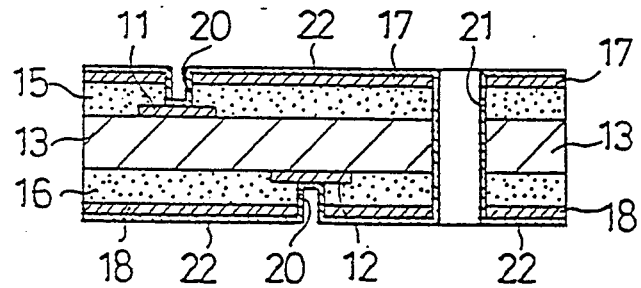
Figure 2K:
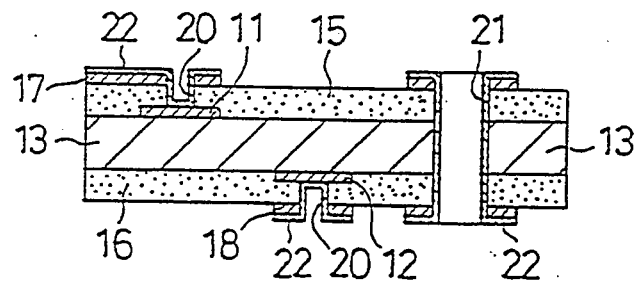

Then, as shown in FIG. 2J, electroless plating is carried out to form a plating layer 22 covering an entire outer surface of the board including the hole portions 20 and the through hole 21. Thereafter, as shown in FIG. 2K, the plating layer 22 and the copper foils 17 and 18 are partially etched off according to a predetermined circuit pattern to obtain a predetermined pattern wiring.

While the above description has been directed to a manufacturing method for a four-layer wiring board by way of example, a multilayer wiring board having five or more conductor layers.

Figure 5:
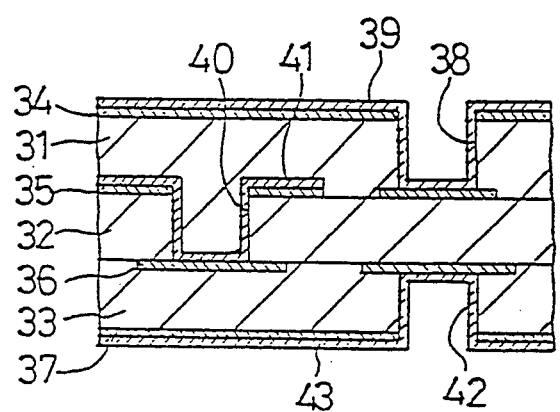

FIG. 5 shows another preferred embodiment of the four-layer wiring board having three insulating layers 31, 32 and 33 and four conductor layers 34, 35, 36 and 37. In this preferred embodiment, a hole portion 40 is preliminarily formed through the inner insulating layer 32, and the inner conductor layers 35 and 36 are electrically connected with each other by a plating layer 41 formed in the hole portion 40. Further, blind hole portions 38 and 42 are formed in the outer insulating layers 31 and 33 through the outer conductor layers 34 and 37, and the outer conductor layers 34 and 37 are electrically connected with the inner conductor layers 35 and 36 by plating layers 39 and 43 formed in the hole portions 38 and 42, respectively. In other words, a so-called buried through hole is formed by blasting of the abrasive powder between the second conductor layer 35 and the third conductor layer 36 before laminating the outer layers, and the formation of the blind holes by blasting of the abrasive powder after laminating the outer layers are carried out to the outer layers only. Accordingly, a depth of etching by the abrasive powder can be made small to thereby improve a working efficiency.

Figure 6:
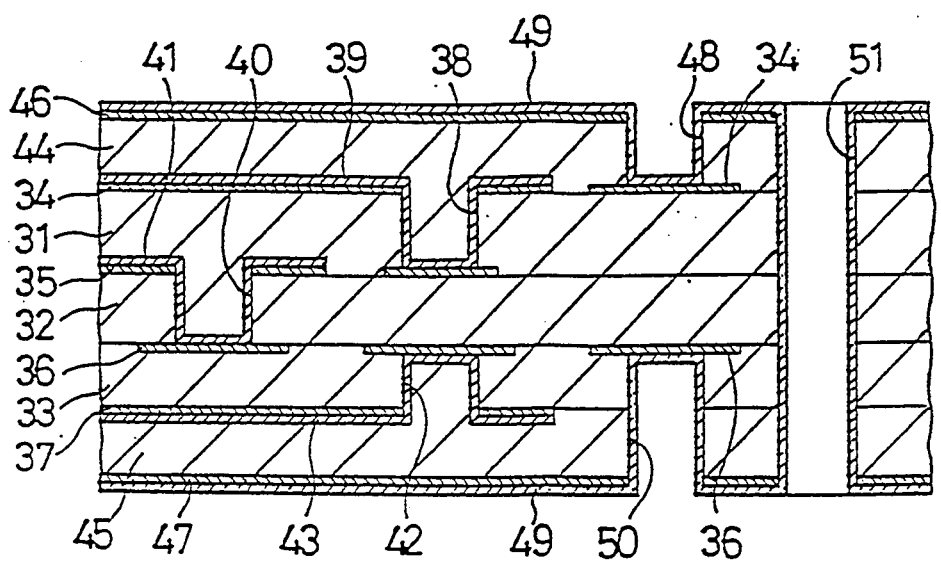
Figure 7:
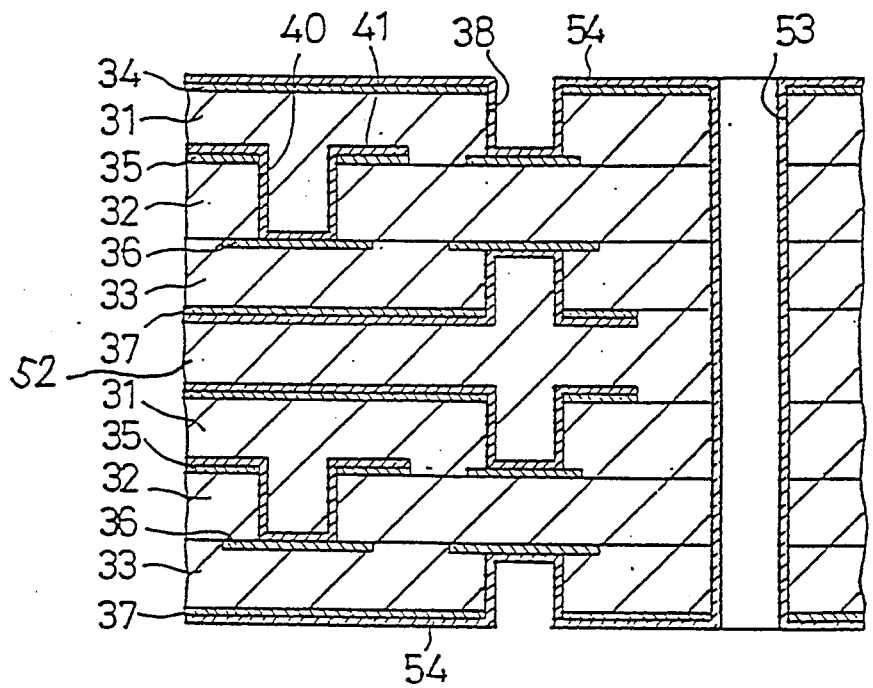

FIGS. 6 and 7 show some preferred embodiments of the multilayer wiring board basically employing the construction of the four-layer wiring board shown in FIG. 5.

In the preferred embodiment shown in FIG. 6, outer conductor layers 46 and 47 are additionally laminated through insulating layers 44 and 45 onto the upper and lower surfaces of the four-layer wiring board shown in FIG. 5, respectively, thereby making a six-layer wiring board. The outer conductor layers 46 and 47 are electrically connected with the inner conductor layers 34 and 36 by a plating layer 49 in blind holes 48 and 50, respectively. Further, the outer conductor layer 46 is electrically connected with the outer conductor layer 47 by the plating layer 49 in a through hole 51.

Naturally, the number of layers can be further increased by additionally laminating conductor layers through insulating layers onto the upper and lower surfaces of the above six-layer wiring board.

In the preferred embodiment shown in FIG. 7, two of the four-layer wiring board shown in FIG. 5 are laminated to each other through an insulating layer 52, thereby making an eight-layer wiring board.

The eight-layer wiring board shown in FIG. 7 is formed in the following manner. That is, patterning is first carried out on one side only of each four-layer wiring board. Then, the pattern formed sides of the two four-layer wiring boards are laminated on opposite sides of the insulating layer 52. Then, a through hole 53 is formed through the thickness of the whole board, and an outermost plating layer 54 is collectively formed by through hole plating. Finally, patterning is carried out on the outermost conductor layers with the plating layer 54.

Having thus described various constructions of the multilayer wiring board having a plurality of conductor layers electrically connected with one another basically by blind holes, further modifications may be made by variously designing a diameter of each blind hole.

Figure 8:
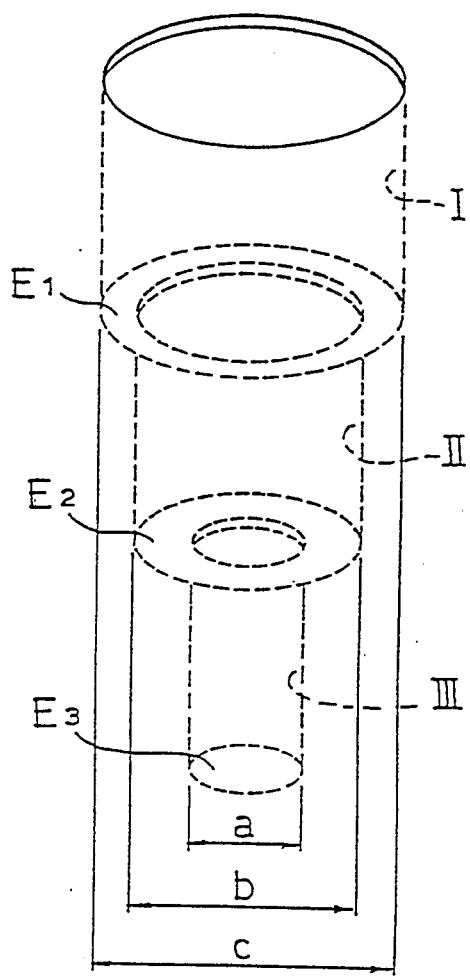
FIGS. 8 and 9 are schematic perspective views showing examples of setting of a diameter of a blind hole portion to be formed into multiple stages.

For instance, by gradually reducing a diameter of a blind hole as shown in FIG. 8, a contact area of a plating layer in each conductor layer can be ensured, and simultaneously the electrical connection of multiple conductor layers can be collectively carried out. More specifically, referring to FIG. 8, the blind hole is comprised of a hole portion I having a diameter c, a hole portion II having a diameter b, and a hole portion III having a diameter a, wherein the relation among these diameters is set to $c>b>a$. With this construction, a second conductor layer $E_1$ is annularly exposed to the bottom of the hole portion I in such a manner that an exposed annulus having an outer diameter c and an inner diameter b is formed. Further, a third conductor layer $E_2$ is annularly exposed to the bottom of the hole portion II in such a manner that an exposed annulus having an outer diameter b and an inner diameter a is formed. Further, a fourth conductor layer $E_3$ is circularly exposed to the bottom of the hole portion III in such a manner that an exposed circle having an outer diameter a is formed.

Figure 9:
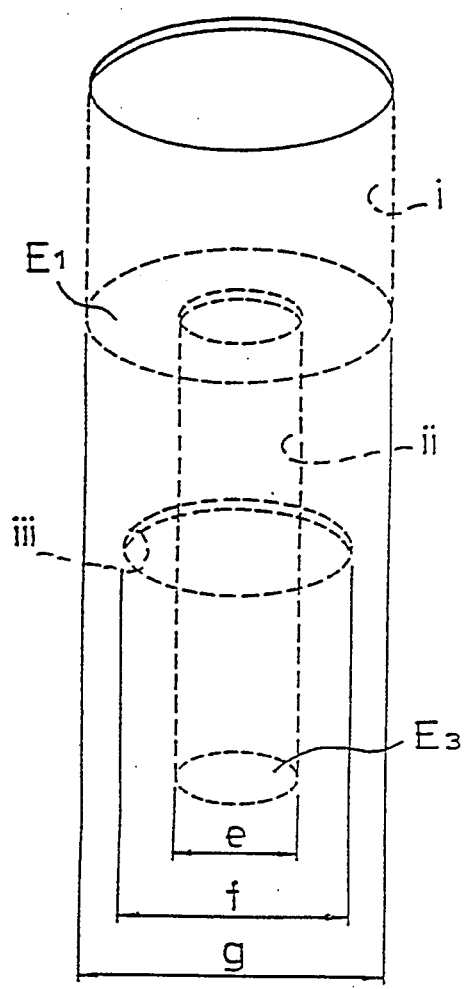

Alternatively, as shown in FIG. 9, by selecting a diameter of a blind hole and a diameter of an opening of each conductor layer, necessary conductor layers only can be electrically connected with each other by the blind hole.

More specifically, referring to FIG. 9, the blind hole is comprised of a hole portion i having a diameter g and a hole portion ii having a diameter e. In particularly, the diameter e of the hole portion ii is set to be smaller than a diameter f of an opening iii formed in a third conductor layer. Accordingly, a second conductor layer $E_1$ is annularly exposed to the bottom of the hole portion i in such a manner that an exposed annulus having an outer diameter g and an inner diameter e is formed. Further, a fourth conductor layer $E_3$ is circularly exposed to the bottom of the hole portion ii in such a manner that an exposed circle having an outer diameter e is formed. However, the third conductor layer is not exposed to the hole portions i and ii. Accordingly, the electrical connection among the first conductor layer, the second conductor layer and the fourth conductor layer can be selectively obtained by through hole plating.

In all of the following preferred embodiments, each four-layer wiring board is comprised of a first insulating layer 61, a second insulating layer 62, a third insulating layer 63, a first conductor layer 64, a second conductor layer 65, a third conductor layer 66, a fourth conductor layer 67, and an outermost plating layer 68 formed on an outer surface of the whole board including a blind hole portion.

In the preferred embodiments shown in FIGS. 10 to 20, the blind hole portion is formed from one side of the board by blasting the abrasive powder.

Figure 10:
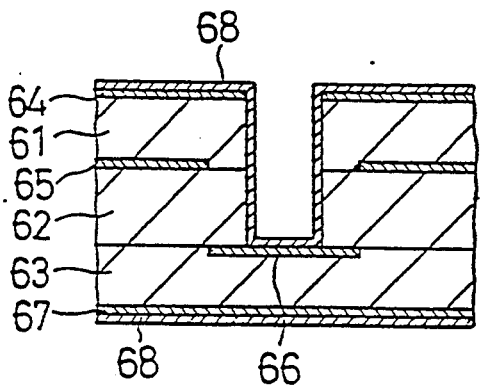
FIGS. 10 to 27 are schematic sectional views showing some preferred embodiments of the connection structure to be obtained through the blind hole portion.

In the preferred embodiment shown in FIG. 10, the construction shown in FIG. 9 is applied to first to third conductor layers in the four-layer wiring board. That is, the first conductor layer 64 is connected with the third conductor layer 66 by the plating layer 68 formed on the wall surface of the blind hole portion, and the second conductor layer 65 arranged between the first conductor layer 64 and the third conductor layer 66 is not connected to these layers 64 and 66.

Figure 11:
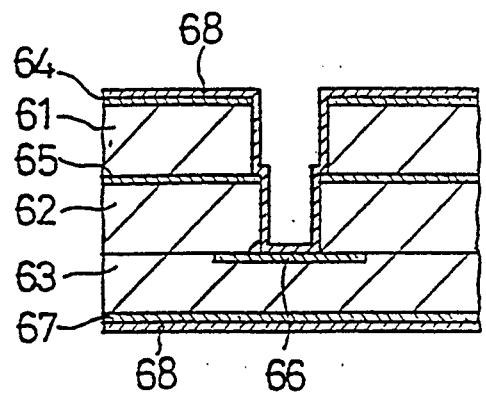

In the preferred embodiment shown in FIG. 11, the construction shown in FIG. 8 is applied to first to third conductor layers in the four-layer wiring board. That is, the first conductor layer 64, the second conductor layer 65 and the third conductor layer 66 are connected with one another by the plating layer 68 formed on the wall surface of the blind hole portion having a gradually reduced diameter, and the fourth conductor layer 67 only is not connected with the first to third conductor layers 64 and 66.

Figure 12:
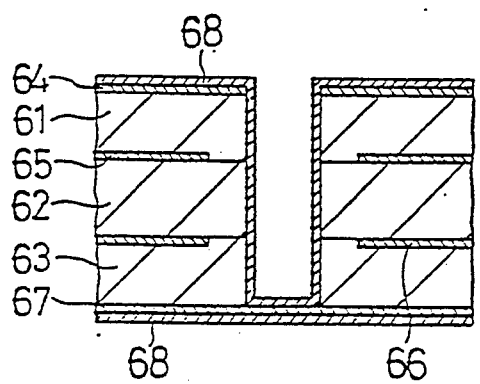

In the preferred embodiment shown in FIG. 12, the first conductor layer 64 is connected with the fourth conductor layer 67 by the plating layer 68 formed on the wall surface of the blind hole portion, and the second conductor layer 65 and the third conductor layer 66 arranged between the first conductor layer 64 and the fourth conductor layer 67 are not connected with these layers 64 and 67.

Figure 13:
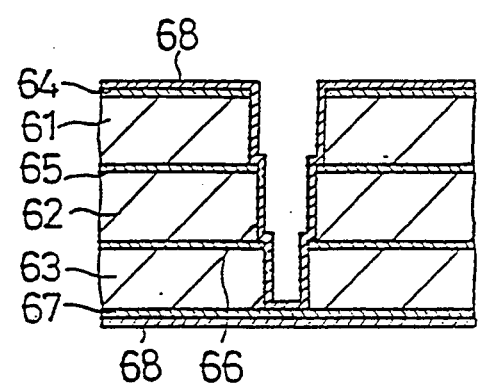

In the preferred embodiment shown in FIG. 13, the structure shown in FIG. 8 is applied to the four-layer wiring board as it is. That is, the blind hole portion has a gradually reduced diameter such that it is stepwise reduced in three stages. The second conductor layer 65, the third conductor layer 66 and the fourth conductor layer 67 are annularly or circularly exposed to the bottoms of the three stages of the blind hole portion, and they are connected with one another by the plating layer 68 under the condition where a contact area between the plating layer 68 and each conductor layer is ensured.

Figure 14:
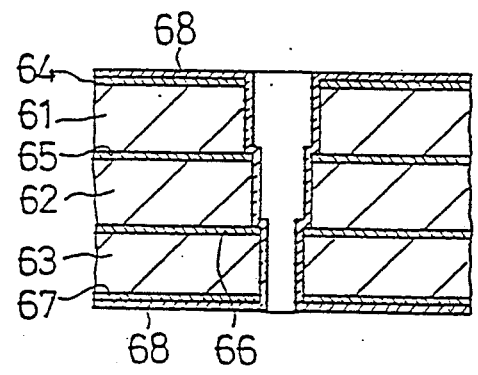

FIG. 14 shows a modification of the structure shown in FIG. 13. In the preferred embodiment shown in FIG. 14, the hole portion is so formed as to also pass through the fourth conductor layer 67. Accordingly, the hole portion has a structure near that of a straight through hole. However, in comparison with the straight through hole, the hole portion shown in FIG. 14 has an advantage from the viewpoint of a contact area between the plating layer 68 and each of the inner conductor layers 65 and 66 since the inner conductor layers 65 and 66 are exposed not only at their opening end surfaces but also annularly to the hole portion.

Figure 15:
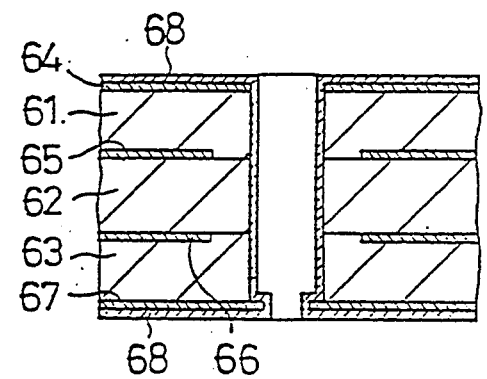

FIG. 15 shows a modification of the structure shown in FIG. 12. In the preferred embodiment shown in FIG. 15, the hole portion is so formed as to pass through the fourth conductor layer 67 at a central portion thereof. Accordingly, the hole portion in this preferred embodiment has a structure near that of a straight through hole, but the structure of this hole portion has an advantage from the viewpoint of a contact area between the plating layer 68 and the fourth conductor layer 67.

Figure 16:
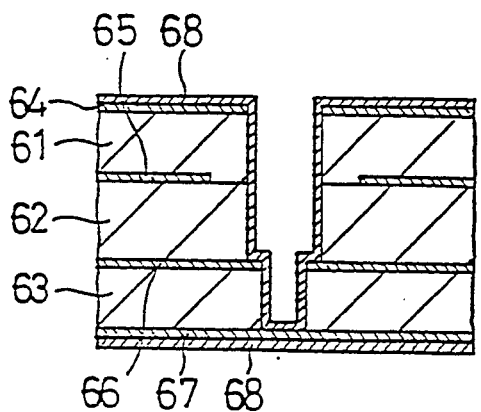
Figure 17:
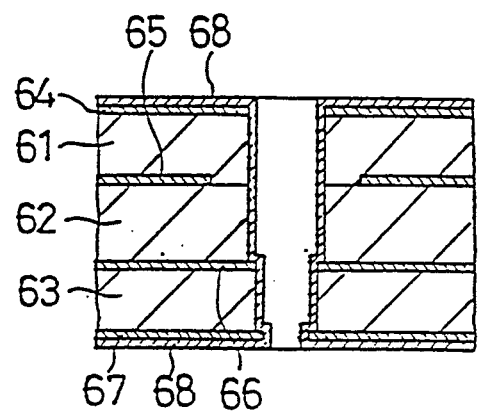

In the preferred embodiments shown in FIGS. 16 and 17, the first conductor layer 64 is connected with the third conductor layer 66 and the fourth conductor layer 67, and the second conductor layer 65 is not connected with the other conductor layers by enlarging a diameter of an opening of the second conductor layer 65. The difference in structure between FIG. 16 and FIG. 17 is such that the hole portion in FIG. 16 is closed at its bottom by the fourth conductor layer 67, while the hole portion in FIG. 17 is open at its bottom in such a manner that the fourth conductor layer 67 is annularly exposed to the bottom of the hole portion.

Figure 18:
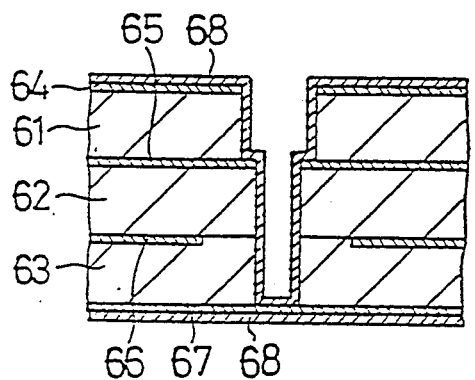
Figure 19:
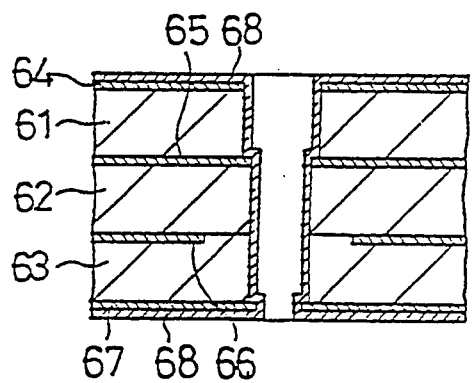

In the preferred embodiments shown in FIGS. 18 and 19, the structure shown in FIG. 9 is applied to the four-layer wiring board as it is. That is, the first conductor layer 64 is connected with the second conductor layer 65 and the fourth conductor layer 67, and the third conductor layer 66 is not connected with the other conductor layers by enlarging a diameter of an opening of the third conductor layer 66. The difference in structure between FIGS. 18 and 19 is such that the hole portion in FIG. 18 is closed at its bottom by the fourth conductor layer 67, while the hole portion in FIG. 19 is open at its bottom in such a manner that the fourth conductor layer 67 is annularly exposed to the bottom of the hole portion.

Figure 20:
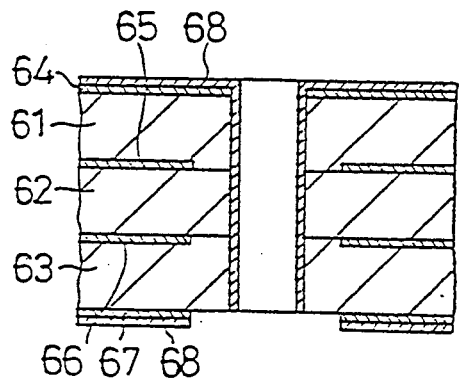

In the preferred embodiment shown in FIG. 20, the hole portion has a structure similar to that of a straight through hole, and the structure of the hole portion is realized by blasting the abrasive powder.

In the following preferred embodiments shown in FIGS. 21 to 26, the blind hole portion is formed from opposite sides of the board by blasting the abrasive powder.

Figure 21:
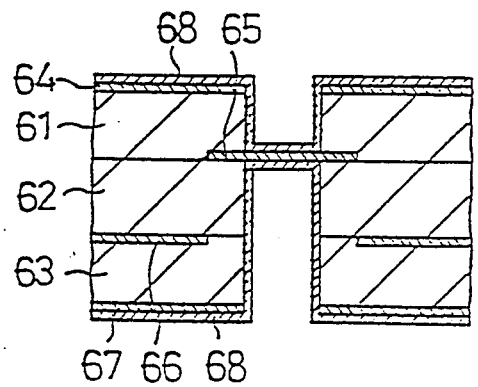

In the preferred embodiment shown in FIG. 21, a first blind hole portion is so formed as to extend from the first conductor layer 64 to the second conductor layer 65, and a second blind hole portion is so formed as to extend from the fourth conductor layer 67 to the second conductor layer 65. The third conductor layer 66 only is not connected with the other conductor layers.

Figure 22:
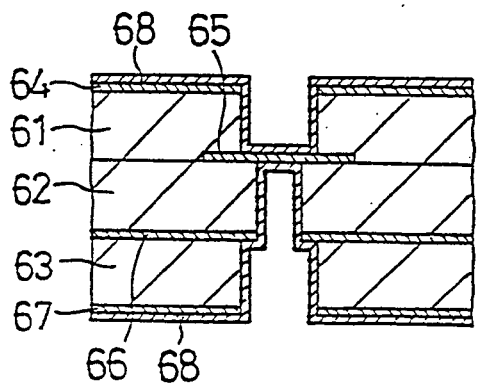

FIG. 22 shows a modification of the structure shown in FIG. 21. While the structure shown in FIG. 22 is similar to that shown in FIG. 21 in that the first blind hole portion is formed from the first conductor layer 64 to the second conductor layer 65, and the second blind hole portion is formed from the fourth conductor layer 67 to the second conductor layer 65, the structure is modified so that a diameter of the second blind hole portion is stepwise reduced to form two stages, and the third conductor layer 66 is connected with the second conductor layer 65 and the fourth conductor layer 67 in the second blind hole portion.

Figure 23:
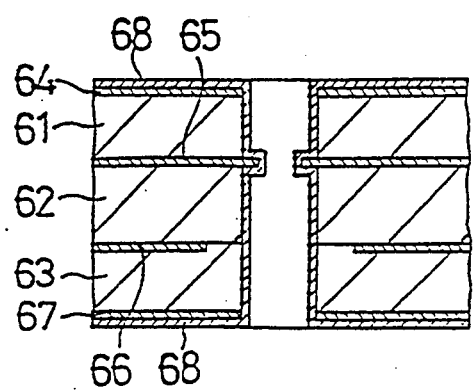
Figure 24:
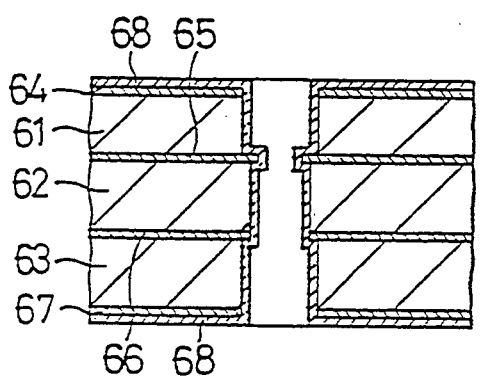

FIGS. 23 and 24 show modifications of the structure shown in FIGS. 21 and 22, respectively. In both the structures shown in FIGS. 23 and 24, the first blind hole portion is communicated with the second blind hole portion through a small hole having a diameter smaller than that of the blind hole portion. That is, the small hole is formed through the second conductor layer 65 at a central portion thereof in the blind hole portion.

Figure 25:
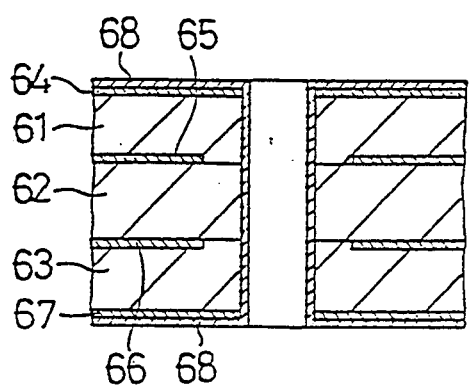

In the preferred embodiment shown in FIG. 25, a straight through hole as the blind hole portion is formed from the opposite sides of the board by blasting the abrasive powder.

Figure 26:
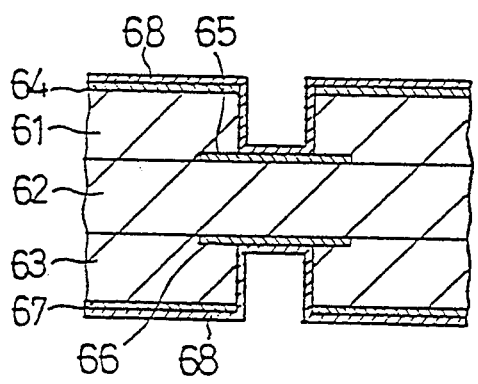

In the preferred embodiment shown in FIG. 26, the first blind hole portion is so formed as to extend from the first conductor layer 64 to the second conductor layer 65, and the second blind hole portion is so formed as to extend from the fourth conductor layer 67 to the third conductor layer 66. The first conductor layer 64 and the second conductor layer 65 are connected with each other by the plating layer 68 formed on the wall surface of the first blind hole portion, while the fourth conductor layer 67 and the third conductor layer 66 are connected with each other by the plating layer 68 formed on the wall surface of the second blind hole portion.

Figure 27:
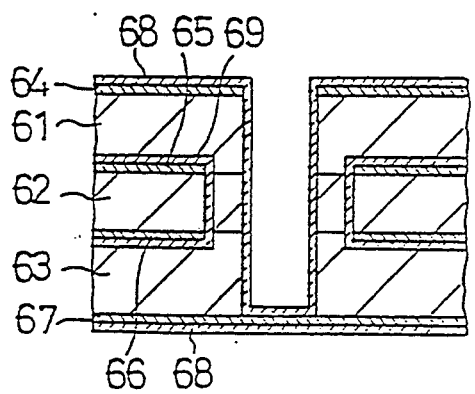

Finally, in the preferred embodiment shown in FIG. 27, the blind hole portion is formed by first forming a straight through hole through an inner substrate by drilling, blasting of the abrasive powder, etc. and then forming a blind hole passing through the straight through hole. That is, a plating layer 69 is formed in the straight through hole, and the second conductor layer 65 is connected with the third conductor layer 66 by the plating layer 69. On the other hand, the first conductor layer 64 is connected with the fourth conductor layer 67 by the plating layer 68 formed in the blind hole passing through the straight through hole. Particularly, the fourth conductor layer 67 is circularly exposed to the bottom of the blind hole. Therefore, a large contact area between the plating layer 68 and the fourth conductor layer 67 can be ensured.

Having thus described various connection structures applied to the four-layer wiring board, it is to be noted that the application of these structures is not limited to the four-layer wiring board. For instance, arbitrary combination of these structures may provide a multi-layer wiring board having an arbitrary number of conductor layers to be laminated.

As apparent from the foregoing description, a contact area between conductor layers can be enlarged, and a wiring board having a high connection reliability can be provided according to the present invention.

Furthermore, according to the manufacturing method of the present invention, as the blind hole is formed by blasting the abrasive powder, a depth of the blind hole can be reliably controlled, thereby efficiently manufacture a wiring board having a high connection reliability. Further, as a diameter of the blind hole to be formed by blasting the abrasive powder can be made very small, the manufacturing method is also advantageous from the viewpoint of high-density wiring. Additionally, the formation of the blind hole by blasting of the abrasive powder can also be applied to an insulating substrate having a composite construction consisting of a filler and a molding material. Accordingly, an insulation property, a mechanical strength, etc. of the insulating substrate are not limited.

We claim as our invention:

1. A method for manufacturing a multilayer wiring board comprising the steps of;
   a) forming a first conductor layer on a second major surface of an insulating substrate,
   b) forming a patterned mask which is resistant to the subsequent etching on a first major surface of said insulating substrate,
   c) blasting a fine abrasive powder from the side of said first major surface to selectively remove said insulating substrate until said first conductor layer is exposed at a bottom of a hole portion thus formed, and
   d) forming a second conductor layer to cover side wall surface of said hole portion and said first conductor exposed at said bottom of said hole portion.

2. A method according to claim 1, wherein said patterned mask is a third conductor layer formed on said first major surface of said insulating substrate.

3. A method according to claim 1, wherein said patterned mask is a third conductor layer formed on said first major surface of said insulating layer and an elastic resinous material layer formed on said third conductor layer.

4. A method according to claim 1, wherein said fine abrasive powder has an average powder diameter not exceeding 16 $\mu$m.

5. A method according to claim 1, wherein said fine abrasive powder has hardness larger than a hardness of said insulating substrate.

* * * * *